US012507455B2

(12) United States Patent
Lin et al.

(10) Patent No.: US 12,507,455 B2
(45) Date of Patent: Dec. 23, 2025

(54) SEMICONDUCTOR DEVICE AND METHOD OF FORMING THE SAME

(71) Applicant: MEDIATEK INC., Hsinchu (TW)

(72) Inventors: Cheng-Hua Lin, Hsinchu (TW); Yan-Liang Ji, Hsinchu (TW); Ching-Han Jan, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 543 days.

(21) Appl. No.: 17/735,282

(22) Filed: May 3, 2022

(65) Prior Publication Data

US 2022/0384608 A1 Dec. 1, 2022

Related U.S. Application Data

(60) Provisional application No. 63/193,137, filed on May 26, 2021.

(51) Int. Cl.
*H10D 64/01* (2025.01)
*H10D 64/23* (2025.01)
*H10D 64/27* (2025.01)

(52) U.S. Cl.
CPC ......... *H10D 64/021* (2025.01); *H10D 64/015* (2025.01); *H10D 64/018* (2025.01);
(Continued)

(58) Field of Classification Search
CPC ........... H01L 29/6656; H01L 29/41783; H01L 29/42356; H01L 29/6653; H01L 29/66553;
(Continued)

(56) References Cited

U.S. PATENT DOCUMENTS

2007/0145430 A1 6/2007 Sandhu
2008/0233691 A1 9/2008 Cheng et al.
(Continued)

FOREIGN PATENT DOCUMENTS

CN 111564498 A 8/2020
JP 2014103204 A 6/2014
(Continued)

OTHER PUBLICATIONS

Chinese language office action dated Jul. 5, 2023, issued in application No. TW 111119039.

*Primary Examiner* — Timor Karimy

(74) *Attorney, Agent, or Firm* — McClure, Qualey & Rodack, LLP

(57) ABSTRACT

A semiconductor device includes a semiconductor substrate having a well region and a gate structure formed over the well region of the semiconductor substrate. The semiconductor device also includes a gate spacer structure having a first spacer portion and a second spacer portion on opposite sidewalls of the gate structure. The semiconductor device also includes a source region and a drain region formed in the semiconductor substrate. The source region and a drain region are separated from the gate structure. The source region is adjacent to the first spacer portion of the gate spacer structure, and the drain region is adjacent to the second spacer portion of the gate spacer structure. The bottom width of the second spacer portion is greater than the bottom width of the first spacer portion.

13 Claims, 11 Drawing Sheets

(52) U.S. Cl.
CPC ......... *H10D 64/259* (2025.01); *H10D 64/512* (2025.01); *H10D 64/01* (2025.01)

(58) Field of Classification Search
CPC .. H01L 29/401; H10D 64/021; H10D 64/259; H10D 64/018; H10D 64/512; H10D 64/015; H10D 64/01
See application file for complete search history.

(56) References Cited

U.S. PATENT DOCUMENTS

| | | | |
|---|---|---|---|
| 2009/0246927 A1* | 10/2009 | Wiatr | H01L 21/823864 257/E21.409 |
| 2010/0025744 A1* | 2/2010 | Miyashita | H01L 21/823864 257/E21.409 |
| 2013/0037866 A1 | 2/2013 | Thees | |
| 2013/0200445 A1 | 8/2013 | Lee | |
| 2014/0183642 A1* | 7/2014 | Liang | H01L 21/823412 438/299 |
| 2017/0263763 A1 | 9/2017 | Ryu et al. | |
| 2017/0323970 A1 | 11/2017 | Dolny et al. | |
| 2019/0140064 A1* | 5/2019 | Bi | H01L 21/823468 |

FOREIGN PATENT DOCUMENTS

| | | | |
|---|---|---|---|
| KR | 100395878 | * | 8/2003 |
| KR | 20090038158 A | | 4/2009 |

* cited by examiner

SEMICONDUCTOR DEVICE AND METHOD OF FORMING THE SAME

CROSS REFERENCE TO RELATED APPLICATIONS

This application is based on, and claims priority of U.S. Provisional Application No. 63/193,137 filed on May 26, 2021, the entirety of which is incorporated by reference herein.

BACKGROUND OF THE INVENTION

Field of the Invention

The present invention relates to a semiconductor device and a method of forming the same, and in particular to a semiconductor device having gate spacers with different bottom widths to improve electrical performance and a method of forming the same.

Description of the Related Art

In recent years, as demand has increased for high-voltage devices, there has been an increase in interest in research on high-voltage metal-oxide-semiconductor (MOS) transistors for use in high-voltage devices. The high-voltage (HV) MOS devices can be used under high voltages, which may be, but are not limited to, voltages higher than the voltage supplied to the I/O circuit. MOS devices such as HVMOS devices may function as switches and are broadly utilized in audio output drivers, CPU power supplies, power management systems, AC/DC converters, LCD or plasma television drivers, automobile electronic components, PC peripheral devices, small DC motor controllers, and other consumer electronic devices.

Although existing semiconductor devices such as MOS devices and methods of forming the same have been adequate for their intended purposes, they have not been entirely satisfactory in all respects. For example, when semiconductor devices are scaled down in size, the complexity of processing and manufacturing those semiconductor devices increases. As semiconductor devices are scaled down to smaller sizes, the lateral distance between electrodes is reduced, which may have a considerable effect on the electrical performance of these semiconductor devices. Also, with progress being made in semiconductor fabrication, the breakdown voltage of high-voltage MOS devices needs to be increased further to meet performance requirements as the demand for semiconductor fabrication of high-voltage devices continues to rise. Therefore, there are still some problems to be overcome in regards to semiconductor devices in the semiconductor integrated circuits and technology.

BRIEF SUMMARY OF THE INVENTION

Some embodiments of the present disclosure provide semiconductor devices. An exemplary embodiment of a semiconductor device includes a semiconductor substrate having a well region and a gate structure formed over the well region of the semiconductor substrate. The semiconductor device also includes a gate spacer structure having a first spacer portion and a second spacer portion on opposite sidewalls of the gate structure. The semiconductor device also includes a source region and a drain region formed in the semiconductor substrate. The source region and a drain region are separated from the gate structure. The source region is adjacent to the first spacer portion of the gate spacer structure, and the drain region is adjacent to the second spacer portion of the gate spacer structure. The bottom width of the second spacer portion is greater than the bottom width of the first spacer portion.

Some embodiments of the present disclosure provide a method of forming a semiconductor device. First, a semiconductor substrate having a well region and an isolation structure adjacent to the well region is provided. Also, a gate structure is formed over the well region of the semiconductor substrate. The method of forming the semiconductor device also includes forming a gate spacer structure having a first spacer portion and a second spacer portion respectively overlying opposite sidewalls of the gate structure. The method of forming the semiconductor device further includes forming a source region and a drain region in the semiconductor substrate. The source region is adjacent to the first spacer portion and the drain region is adjacent to the second spacer portion. In some embodiments, the bottom width of the second spacer portion is greater than the bottom width of the first spacer portion.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
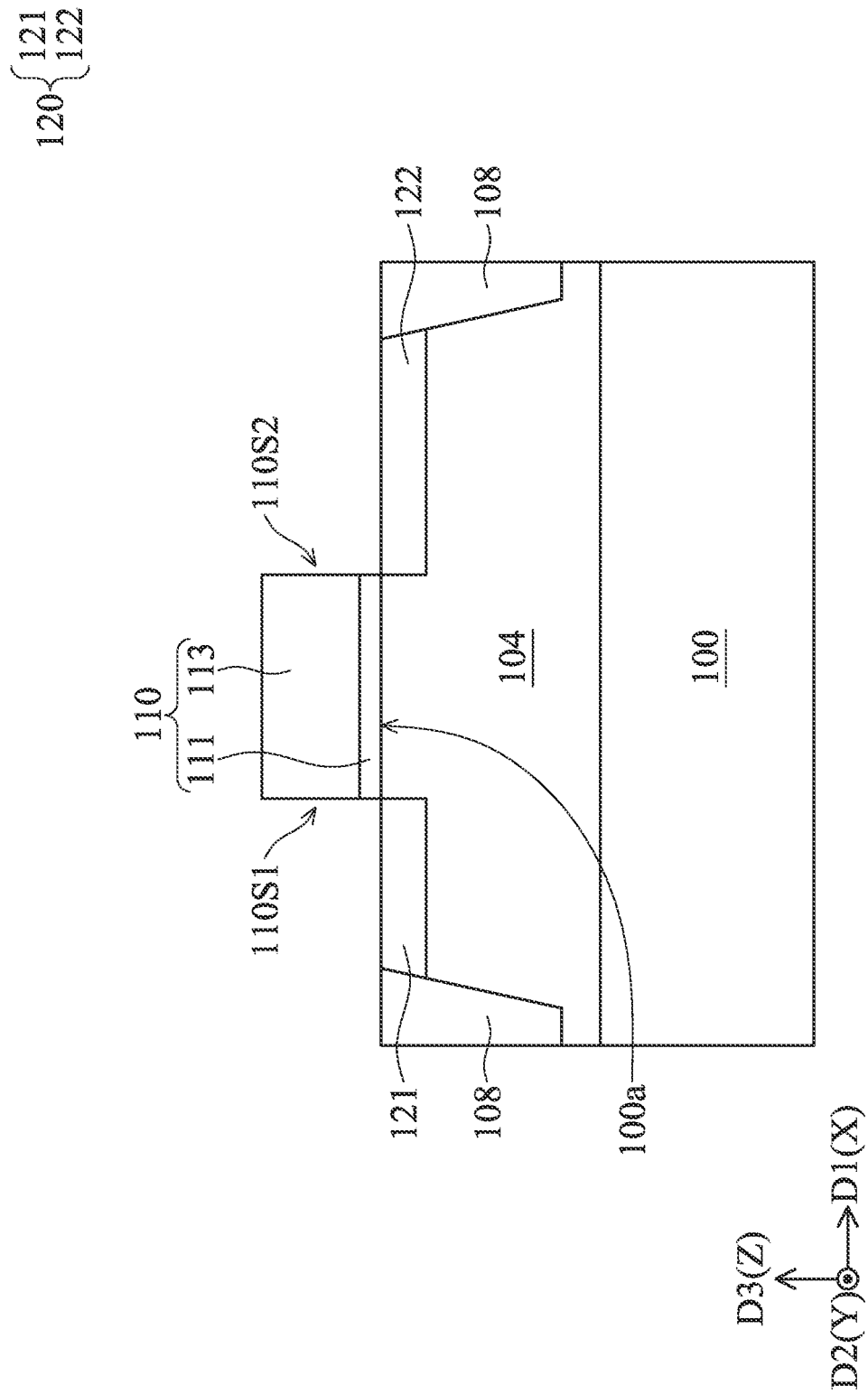
FIG. 1A, FIG. 1B, FIG. 1C, FIG. 1D, FIG. 1E, FIG. 1F, FIG. 1G, FIG. 1H and FIG. 1I are cross-sectional views of intermediate stages of a method of forming a semiconductor device, in accordance with some embodiments of the present disclosure.

The following description is of the best-contemplated mode of carrying out the invention. This description is made for the purpose of illustrating the general principles of the invention and should not be taken in a limiting sense. The scope of the invention is determined by reference to the appended claims.

The inventive concept is described fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. Also, the drawings as illustrated are only schematic and are non-limiting. In the drawings, the size of some of the elements may be exaggerated for illustrative purposes and not drawn to scale. The dimensions and the relative dimensions do not correspond to actual dimensions in the practice of the invention.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It should be understood that when an element is referred to as being "connected" or "contacting" to another element, it may be directly connected to or contacting the other element, or intervening elements may be present.

Similarly, it should be understood that when an element such as a layer, region or substrate is referred to as being "on" another element, it can be directly on the other element or intervening elements may be present. In contrast, the term "directly" means that there are no intervening elements. It should be understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Furthermore, spatially relative terms, such as "beneath," "below," "above," "upper" and the like, may be used herein for ease of description to describe one element or feature's relationship to another element(s) or feature(s) as illustrated in figures. The spatially relative terms are intended to encompass different orientations of the device in use or operation in addition to the orientation depicted in the figures. It should be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same (or similar) reference numerals or reference designators are used to denote elements that are the same or similar throughout the specification.

Some embodiments of the disclosure are described. It should be noted that additional procedures can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with procedures performed in a particular order, these procedures may be performed in another logical order.

According to some embodiments of the present disclosure, a semiconductor device and a method of forming the same are described below, wherein a gate spacer structure having two spacer portions with different bottom widths is formed for extending the distance between a drain region and a gate structure of the semiconductor device. In some embodiments, a semiconductor device includes a semiconductor substrate having a well region, a gate structure formed over the well region of the semiconductor substrate, a source region and a drain region formed in the semiconductor substrate and separated from the gate structure, and a gate spacer structure on opposite sidewalls of the gate structure. The source region and the drain region are positioned near opposite sides of the gate structure. The gate spacer structure includes a first spacer portion and a second spacer portion on opposite sidewalls of the gate structure. The first spacer portion is adjacent to the source region and the second spacer portion is adjacent to the drain region. In some embodiments, the bottom width of the second spacer portion is greater than the bottom width of the first spacer portion.

The electrical performance of the semiconductor device in accordance with some embodiments of the present disclosure can be significantly improved. For example, a safe operating area (SOA) diagram that defines the maximum values of drain-source voltage (VD's) and drain current (ID) for correct functioning of a semiconductor device such as a metal-oxide semiconductor field-effect transistor (MOSFET) can be improved. In some embodiments, the extended distance between the drain region and the gate structure of the semiconductor device increases the breakdown voltage and enlarges the zone of the safe operating area (SOA). Also, when the bottom width of the second spacer portion that is adjacent to the drain region is greater than the bottom width of the first spacer portion that is adjacent to the source region, the lateral distance between the drain region and the gate structure is greater than the lateral distance between the source region and the gate structure of the semiconductor device, so that the undesirable parasite capacitance between the gate structure and a drain contact plug that is connected to the drain region can be reduced. Accordingly, operating the semiconductor device of some embodiments of the present disclosure at a higher switching speed is allowed.

Some of the methods of forming the semiconductor device in accordance with some embodiments of the present disclosure are provided below. It should be noted that the present disclosure is not limited to the exemplified methods and structures described herein. Those steps and structures described below are merely for providing examples of the fabrication and configuration of the semiconductor device.

FIG. 1A, FIG. 1B, FIG. 1C, FIG. 1D, FIG. 1E, FIG. 1F, FIG. 1G, FIG. 1H and FIG. 1I are cross-sectional views of intermediate stages of a method of forming a semiconductor device, in accordance with some embodiments of the present disclosure. To simplify the diagram, only a single transistor is depicted herein. However, the number of transistors is not limited thereto.

Referring to FIG. 1A, a semiconductor substrate 100 with a well region 104 and an isolation structure 108 adjacent to the well region 104 is provided. Also, a gate structure 110 is formed over the well region 104 of the semiconductor substrate 100. In some embodiments, the semiconductor substrate 100 is a silicon substrate. The semiconductor substrate 100 may have a first conductivity type such as P-type. The well region 104 is formed in the semiconductor substrate 100 and may have the second conductive type, for example N-type.

Although only the well region 104 is depicted in the semiconductor substrate 100 for the purpose of brevity, the semiconductor substrate 100 may further include other features such as other well regions. For example, the semiconductor substrate 100 may further include a deep well region (not shown) having a second conductive type that is the opposite of the first conductivity type, for example N-type. Also, the semiconductor substrate 100 may further include a well region (not shown) having a first conductivity type such as P-type (referred to as a P-well region) formed in the deep well region, wherein a portion of the P-well region extends between the deep well region and the well region 104. The well region 104 may be formed within the P-well region and surrounded by the isolation structure 108 and the P-well region.

As shown in FIG. 1A, the isolation structure 108 that extends downward from the upper surface 100*a* of the semiconductor substrate 100 is embedded in the semiconductor substrate 100. In some embodiments, the isolation structure 108 includes shallow trench isolation (STI) elements. In some embodiments, the isolation structure 108 includes field oxide (FOX) isolation elements. The isolation structure 108 may include silicon oxide, another suitable insulating material, or a combination thereof.

In some embodiments, the gate structure 110 is formed on the upper surface 100*a* of the semiconductor substrate 100 and over the well region 104 of the semiconductor substrate 100. The gate structure 110 has the first sidewall 110S1 and the second sidewall 110S2 opposite to the first sidewall 110S1. The gate structure 110 may include a gate dielectric layer 111 and a conductive layer 113 on the gate dielectric layer 111. The gate structure 110 may be formed by a photolithography process for patterning the material layers of the gate dielectric layer 111 and the conductive layer 113. Although only one gate structure 110 of a transistor is depicted in the drawings, several gate structures 110 of the transistors may be formed in the application, and those gate structures 110 may be spaced apart from each other in the first direction D1 (such as X-direction). In addition, in some embodiments, the gate structure 110 extends in the second direction D2 (such as Y-direction).

The gate dielectric layer 111 may be a single layer or a multi-layered structure. In some embodiments, the gate dielectric layer 111 is a silicon oxide layer. In some embodiments, the gate dielectric layer 111 is formed of oxides, oxynitrides, nitrides, high-k materials, other suitable materials, or a combination thereof. In one example, the gate dielectric layer 111 may include an interfacial layer (not shown) and a high-k dielectric layer formed on the interfacial layer. The interfacial layer, the high-k dielectric layer and the conductive layer 113 are stacked in the third direction D3 (such as Z-direction). For example, the interfacial layer may be formed on the semiconductor substrate 100 and include a silicon oxide layer. The high-k dielectric layer may be formed on the interfacial layer by atomic layer deposition (ALD) or other suitable technique. The conductive layer 113 may be formed on the high-k dielectric layer. The high-k dielectric layer may include hafnium oxide (HfO$_2$). Alternatively, the high-k dielectric layer may optionally include other high-k dielectrics such as hafnium silicon oxide (HfSiO), hafnium silicon oxynitride (HfSiON), hafnium tantalum oxide (HMO), hafnium titanium oxide (HMO), hafnium zirconium oxide (HfZrO), and combinations thereof. It should be noted that the gate dielectric layer 111 of the present disclosure is not limited to include the aforementioned materials.

The conductive layer 113 of the gate structure 110 can be referred to as a gate electrode. In some embodiments, the conductive layer 113 includes polysilicon, metal, metal silicide, metal nitride, another suitable material, or a combination thereof. Exemplified metal materials of the conductive layer 113 include TiN, TaN, ZrSi$_2$, MoSi$_2$, TaSi$_2$, NiSi$_2$, WN, or another suitable metal material. Also, in some embodiments, the conductive layer 113 is formed of polysilicon, such as doped polysilicon. The conductive layer 113 of the gate structure 110 can be formed by a deposition method, such as chemical vapor deposition (CVD), physical vapor deposition (PVD), sputtering, plating, or another suitable method.

In some embodiments, the gate structure 110 further includes a hard mask (not shown) formed over the conductive layer 113. The hard mask may be formed by a deposition process or another suitable process. The hard mask may include silicon nitride, silicon oxynitride, silicon carbide, another suitable material, or a combination thereof. To simplify the diagram, one gate dielectric layer 111 and one conductive layer 113 are depicted herein for illustrating the gate structure 110.

In addition, in some embodiments, lightly doped regions (LDD) 120 are further formed in the semiconductor substrate 100. As shown in FIG. 1A, the lightly doped regions (LDD) 120 includes a first lightly doped region 121 and a second lightly doped region 122. The first lightly doped region 121 is adjacent to the first sidewall 110S1 of the gate structure 110. The second lightly doped region 122 is adjacent to the second sidewall 110S2 of the gate structure 110. In some embodiments, the lightly doped regions (LDD) 120 can be formed by using the gate structure as an implant mask.

Figure 1B:
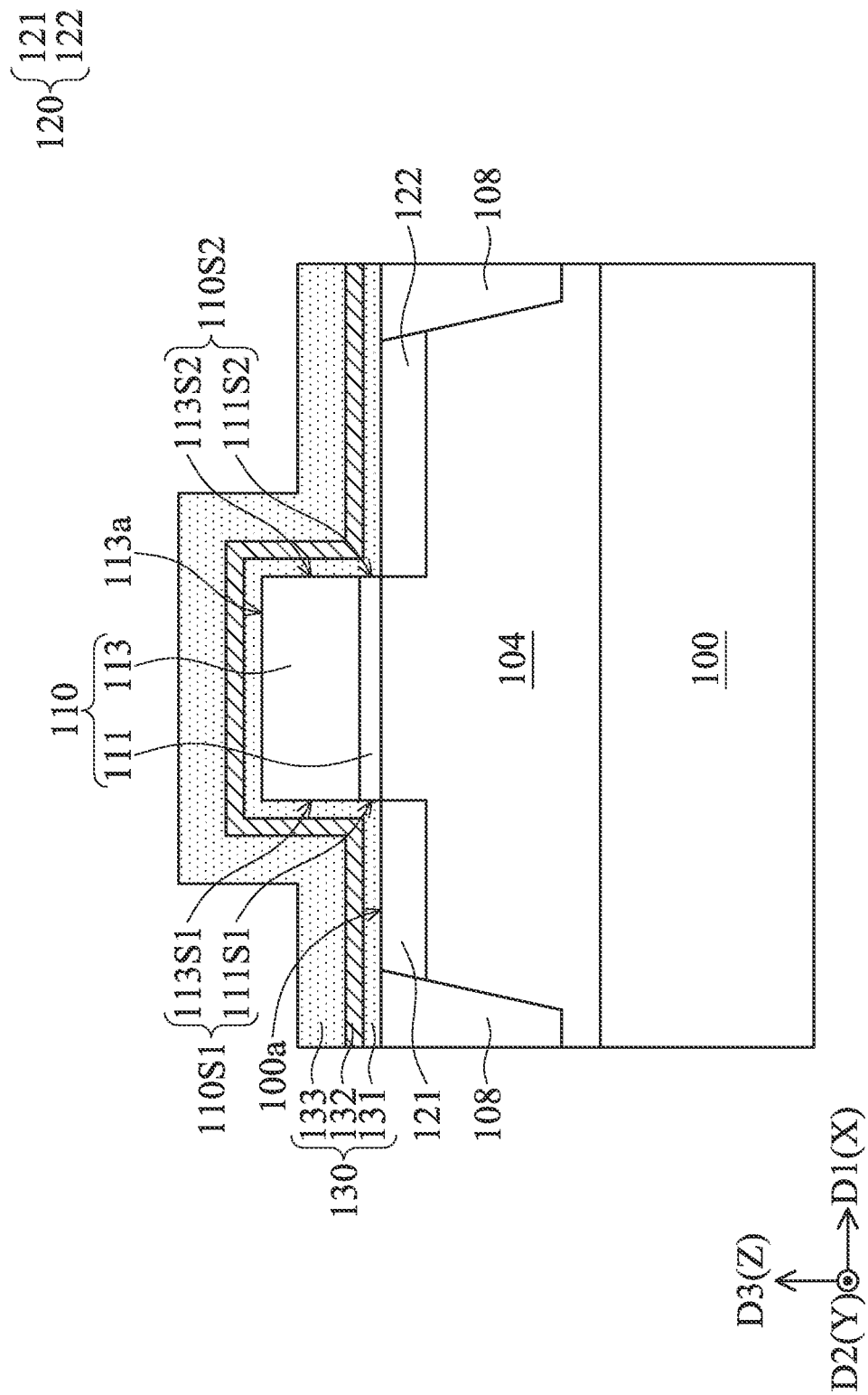

Next, a gate spacer material layer 130 that includes one or more spacer material layers is formed over the semiconductor substrate 100, and the gate spacer material layer 130 covers the gate structure 110 (e.g. FIG. 1B). Then, an initial gate spacer layer that has symmetrical portions respectively overlying the first sidewall 110S1 and the second sidewall 110S2 of the gate structure 110 is formed (e.g. FIG. 1C). In this exemplified embodiment, three spacer material layers formed over the semiconductor substrate 100 are depicted for illustration. However, it should be noted that the number of spacer material layers forming the initial gate spacer layer of the present disclosure is not limited to the exemplified embodiment provided herein.

Referring to FIG. 1B, a gate spacer material layer 130 having three spacer material layers is formed over the semiconductor substrate 100 and covers the gate structure 110. In some embodiments, the gate spacer material layer 130 includes a first spacer material layer 131, a second spacer material layer 132 and a third spacer material layer 133.

First, the first spacer material layer 131 is formed on the upper surface 100*a* of the semiconductor substrate 100 and conformally formed on the first sidewall 110S1 and the second sidewall 110S2 of the gate structure 110. In this exemplified embodiment, the first sidewall 110S1 of the gate structure 110 includes the first sidewall 111S1 of the gate dielectric layer 111 and the first sidewall 113S1 of the conductive layer 113. The second sidewall 110S2 of the gate structure 110 includes the second sidewall 111S2 of the gate dielectric layer 111 and the second sidewall 113S2 of the conductive layer 113. Accordingly, the first spacer material layer 131 is formed on the isolation structure 108 and the lightly doped regions (LDD) 120 (e.g. including the first lightly doped region 121 and the second lightly doped region 122), and conformally formed on the first sidewall 111S1 of the gate dielectric layer 111, the first sidewall 113S1 of the conductive layer 113, the top surface 113*a* of the conductive layer 113, the second sidewall 113S2 of the conductive layer 113 and the second sidewall 111S2 of the gate dielectric layer 111, as shown in FIG. 1B.

Then, the second spacer material layer 132 is conformally formed on the first spacer material layer 131, and the third spacer material layer 133 is conformally formed on the second spacer material layer 132. The thickness of the third spacer material layer 133 can be adjusted according to a required bottom width of an additional spacer portion (e.g. the remaining initial spacer portion 1332 in FIG. 1E) of the spacer portion (e.g. the second spacer portion GS-2) near the drain region in the subsequent processes.

Spacer materials can be selected and varied based on the design requirements for forming the semiconductor device. In some embodiments, the first spacer material layer 131 (as a liner spacer layer) is formed of silicon oxide, oxynitride, silicon nitride, or another suitable material. Also, the second spacer material layer 132 and the third spacer material layer 133, for example, are dielectric layers with low dielectric constant (low-k). The k values of the second spacer material layer 132 and the third spacer material layer 133 may be in a range from about 4.2 to about 5.5. In some embodiments, the first spacer material layer 131, the second spacer material layer 132 and the third spacer material layer 133 and the fourth spacer material layer 134 are low-k dielectric with impurities therein. The precursor of the deposition process of the low-k dielectric with impurities may include a boron-containing gas, such as $BCl_3$, $BH_3$, or $B_2H_6$, or a carbon-containing gas, such as $C_2H_4$ or $C_2H_6$. In some embodiments, the space materials include oxide, nitride, oxynitride with boron, carbon, fluorine, or combinations thereof. In some embodiments, the space materials include silicon carbide with boron, nitrogen, fluorine, or combinations thereof. Also, it should be noted that suitable dielectric material of the third spacer material layer 133 will exhibit low-k characteristics in conjunction with high etch selectivity in comparison to the underlying second spacer material layer 132.

In this exemplified embodiment, the first spacer material layer 131 and the third spacer material layer 133 include but not limited to silicon oxide, while the second spacer material layer 132 includes but not limited to silicon nitride. In some other embodiments, the second spacer material layer 132 is a silicon nitride layer with impurity of boron, carbon, fluorine, or combinations thereof. The precursor of a deposition process for forming the silicon nitride layer includes a silicon-containing gas, such as $SiH_2Cl_2$, $Si_2H_6$, $SiH_4$, $Si_2C_{16}$, or BTBAS, and a nitrogen-containing gas, such as $NH_3$, $N_2$, or $N_2O$.

In addition, the first spacer material layer 131, the second spacer material layer 132 and the third spacer material layer 133 may be formed by using commonly used techniques, such as plasma enhanced chemical vapor deposition (PECVD), low-pressure chemical vapor deposition (LPCVD), sub-atmospheric chemical vapor deposition (SACVD), atomic layer deposition (ALD), or another suitable deposition.

Figure 1C:
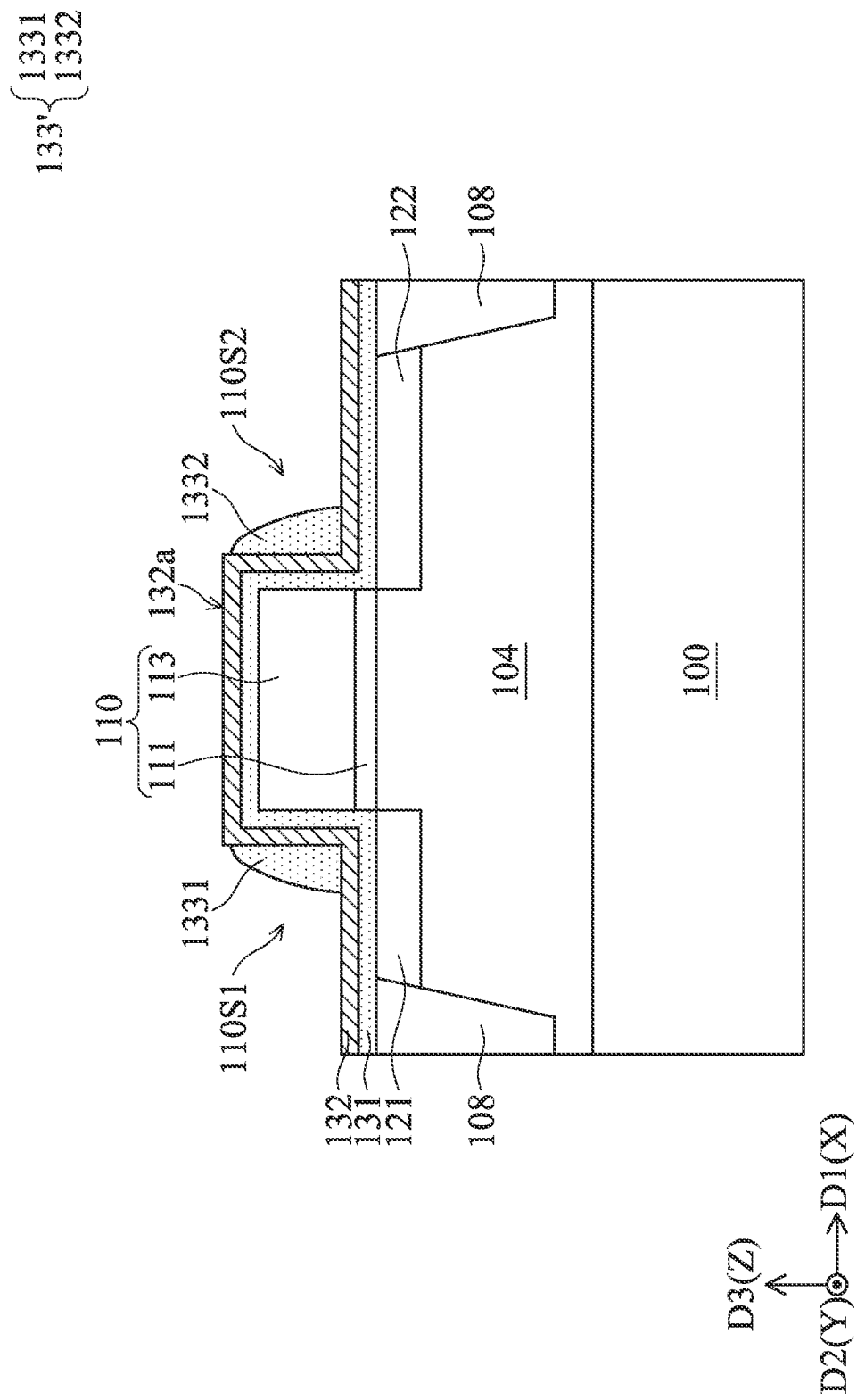

Referring to FIG. 1C, the third spacer material layer 133 is patterned to form an initial gate spacer layer 133' having symmetrical portions 1331 and 1332 overlying the second spacer material layer 132. In some embodiments, the symmetrical portions 1331 and 1332 of the initial gate spacer layer 133' are positioned near the first sidewall 110S1 and the second sidewall 110S2 of the gate structure 110, respectively. Also, the top surface 132a of the second spacer material layer 132 above the gate structure 110 is exposed after the symmetrical portions 1331 and 1332 are formed.

The third spacer material layer 133 can be patterned by a wet etching process, a dry etching process, or combinations thereof. In some embodiments, the third spacer material layer 133 is patterned by a dry etching process. In some embodiments, the third spacer material layer 133 is patterned by an anisotropic dry etching process. Also, the patterning step is performed on the third spacer material layer 133 without any mask provided above the gate spacer material layer 130. In addition, in this exemplified embodiment, an anisotropic etch to the third spacer material layer 133 (e.g. the silicon oxide layer) provides high selectivity to the second spacer material layer 132 (e.g. the silicon nitride layer), and the second spacer material layer 132 is substantially not etched during the patterning step performed on the third spacer material layer 133.

Referring to FIG. 1D, FIG. 1E, FIG. 1F, FIG. 1G and FIG. 1H which depict the steps of forming a gate spacer structure GS comprising two asymmetrical portions (e.g. the first spacer portion GS-1 and the second spacer portion GS-2 with different bottom widths) on opposite sidewalls of the gate structure 110, in accordance with some embodiments of the present disclosure. According to the embodiment, the asymmetrical portions of the gate spacer structure GS on opposite sidewalls of the gate structure 110 are introduced into the semiconductor device to extend the lateral distance (e.g. in the first direction D1, such as X-direction) between the gate structure 110 and a drain region (e.g. the drain region 162 in FIG. 1H) that is formed subsequently.

Figure 1D:
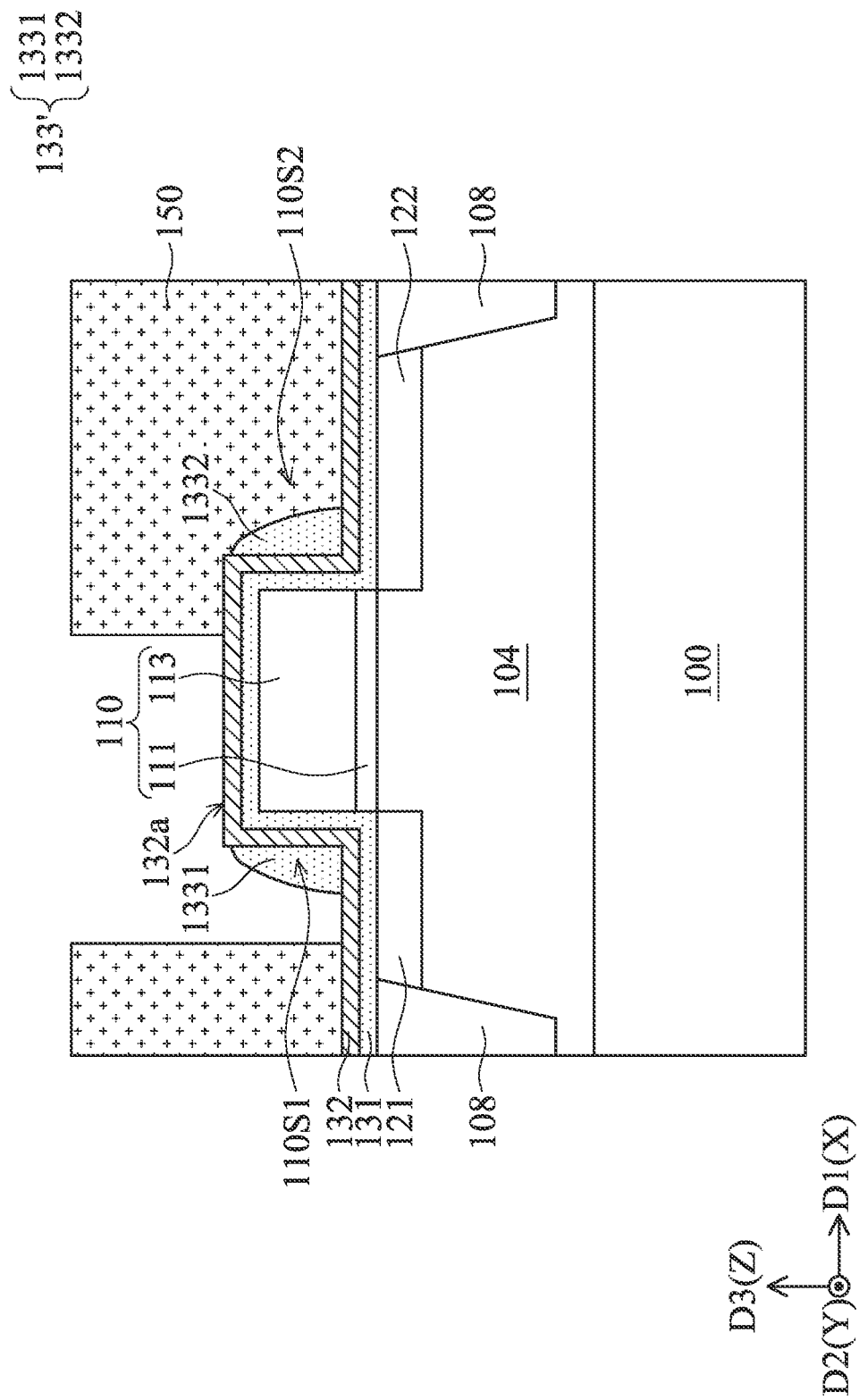

Referring to FIG. 1D, a patterned mask layer 150 is provided over the semiconductor substrate 100 to expose one of the symmetrical portions 1331 and 1332 of the initial gate spacer layer 133'. In some embodiments, a source region and a drain region (e.g. the source region 161 and the drain region 162 in FIG. 1H) are subsequently formed adjacent to the first sidewall 110S1 and the second sidewall 110S2 of the gate structure 110, respectively. Therefore, the patterned mask layer 150 exposes the symmetrical portion 1331 near the first sidewall 110S1 of the gate structure 110, but covers the symmetrical portion 1332 near the second sidewall 110S2 of the gate structure 110. Also, the patterned mask layer 150 covers a portion of the top surface 132a of the second spacer material layer 132. In some embodiments, the patterned mask layer 150 includes material such as photoresists or the like.

Figure 1E:
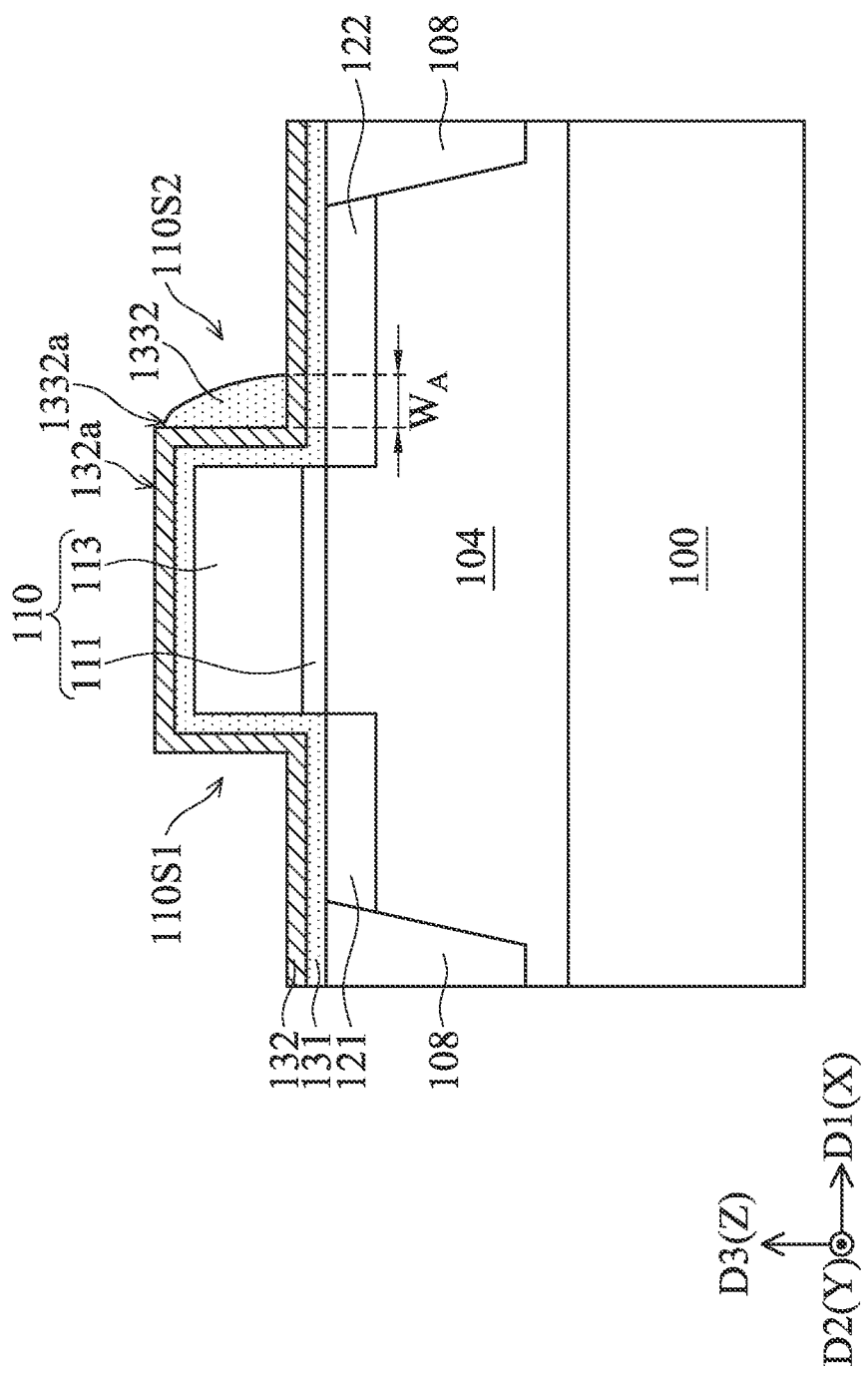

Referring to FIG. 1E, in some embodiments, the symmetrical portion 1331 on the first sidewall 110S1 of the gate structure 110 and not covered by the patterned mask layer 150 is removed. It should be noted that the symmetrical portion 1331 of the initial gate spacer layer 133' can be partially removed or completely removed, as long as the bottom width (in the first direction D1) of the remaining portion of the symmetrical portion 1441 near the first sidewall 110S1 of the gate structure 110 is less than the bottom width (in the first direction D1) of the symmetrical portion 242 near the second sidewall 110S2 of the gate structure 110. In this exemplified embodiment, as shown in FIG. 1E, the symmetrical portion 1331 of the initial gate spacer layer 133' is completely removed, and the portion of the second spacer material layer 132 that is near the first sidewall 110S1 of the gate structure 110 is exposed.

In some embodiments, the symmetrical portion 1331 of the initial gate spacer layer 133' is removed by selective etching process. The etching process may include a dry etching process, a wet etching process, another suitable process, or a combination thereof. In this exemplified embodiment, the symmetrical portion 1331 of the initial gate spacer layer 133' can be removed by a wet etching process.

Also, since the patterned mask layer 150 fully covers the symmetrical portion 1332 of the initial gate spacer layer 133', the symmetrical portion 1332 completely remains near the second sidewall 110S2 of the gate structure 110 after the patterned mask layer 150 is removed. For the purpose of brevity, the remained symmetrical portion 1332 near the second sidewall 110S2 of the gate structure 110 can also be referred to as the remaining initial spacer portion 1332 in the following descriptions. The remaining initial spacer portion 1332 is formed for increasing the bottom width of the second spacer portion GS-2 that is formed in the subsequent process.

After the symmetrical portion 1331 of the initial gate spacer layer 133' is removed, the patterned mask layer 150 is removed. The patterned mask layer 150 may be removed by stripping, ashing, another suitable process, or a combination thereof.

Next, in some embodiments, one or more spacer material layers are formed on the exposed second spacer material layer 132 and the remaining initial spacer portion 1332 near the second sidewall 110S2 of the gate structure 110. In this exemplified embodiment, one spacer material layer that is conformally formed over the substrate 100 is depicted herein. However, the number of spacer material layers of the present disclosure is not limited thereto.

Figure 1F:
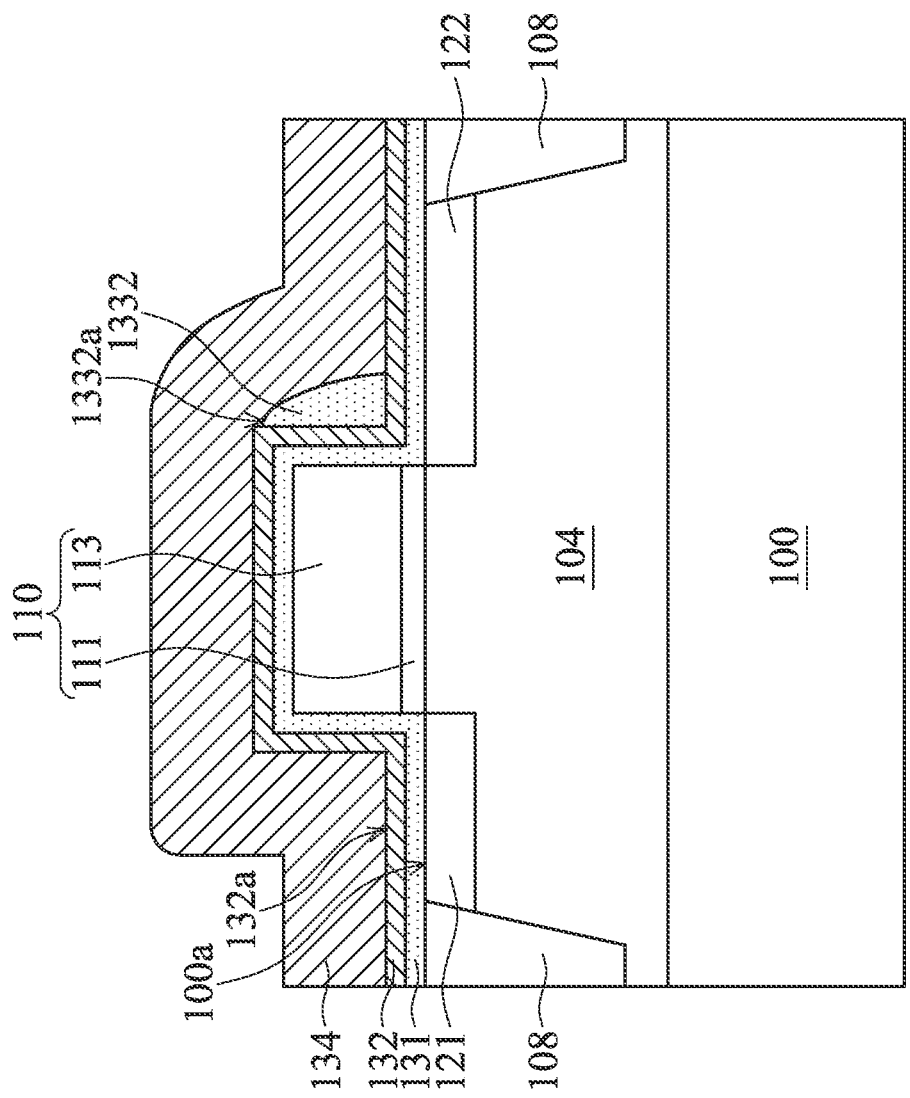

Referring to FIG. 1F, in some embodiments, a fourth spacer material layer 134 is conformally formed on the exposed second spacer material layer 132 and the remaining initial spacer portion 1332. Specifically, the fourth spacer material layer 134 covers the top surface 132a of the exposed second spacer material layer 132 and the outer surface of the remaining initial spacer portion 1332. As shown in FIG. 1F, the remaining initial spacer portion 1332 is sandwiched between the fourth spacer material layer 134 and the second spacer material layer 132.

In some embodiments, the fourth spacer material layer 134 is formed of silicon oxide, oxynitride, silicon nitride, or another suitable material. Also, the fourth spacer material layer 134, for example, is a dielectric layer with low dielectric constant (low-k). The k values of the fourth spacer material layer 134 may be in a range from about 4.2 to about 5.5. In some embodiments, the fourth spacer material layer 134 is made of low-k dielectric with impurities therein. The precursor of the deposition process of the low-k dielectric with impurities may include a boron-containing gas, such as $BCl_3$, $BH_3$, or $B_2H_6$, or a carbon-containing gas, such as $C_2H_4$ or $C_2H_6$. In some embodiments, the fourth spacer material layer 134 includes oxide, nitride, oxynitride with impurities such as boron, carbon, fluorine, or combinations thereof. In some embodiments, the fourth spacer material layer 134 includes silicon carbide with impurities such as boron, nitrogen, fluorine, or combinations thereof.

In some embodiments, the fourth spacer material layer 134 and the second spacer material layer 132 are made of the same material. In one example, the fourth spacer material layer 134 and the second spacer material layer 132 include, but are not limited to, silicon nitride. However, the fourth spacer material layer 134 and the second spacer material layer 132 may be made of different materials. For example, the fourth spacer material layer 134 is made of silicon oxide whereas the second spacer material layer 132 is made of silicon nitride. Suitable materials can be used in forming the fourth spacer material layer 134 and the second spacer material layer 132, thereby forming a gate spacer structure GS with asymmetrical portions (e.g. the first spacer portion GS-1 and the second spacer portion GS-2 with different bottom widths in FIG. 1H) subsequently.

Next, in some embodiments, the fourth spacer material layer 134 and the second spacer material layer 132 that are formed over the upper surface 100a of the semiconductor substrate 100 and cover the gate structure 110 are patterned to form gate spacer portions on opposite sidewalls of the gate structure 110, in accordance with some embodiments.

Figure 1G:
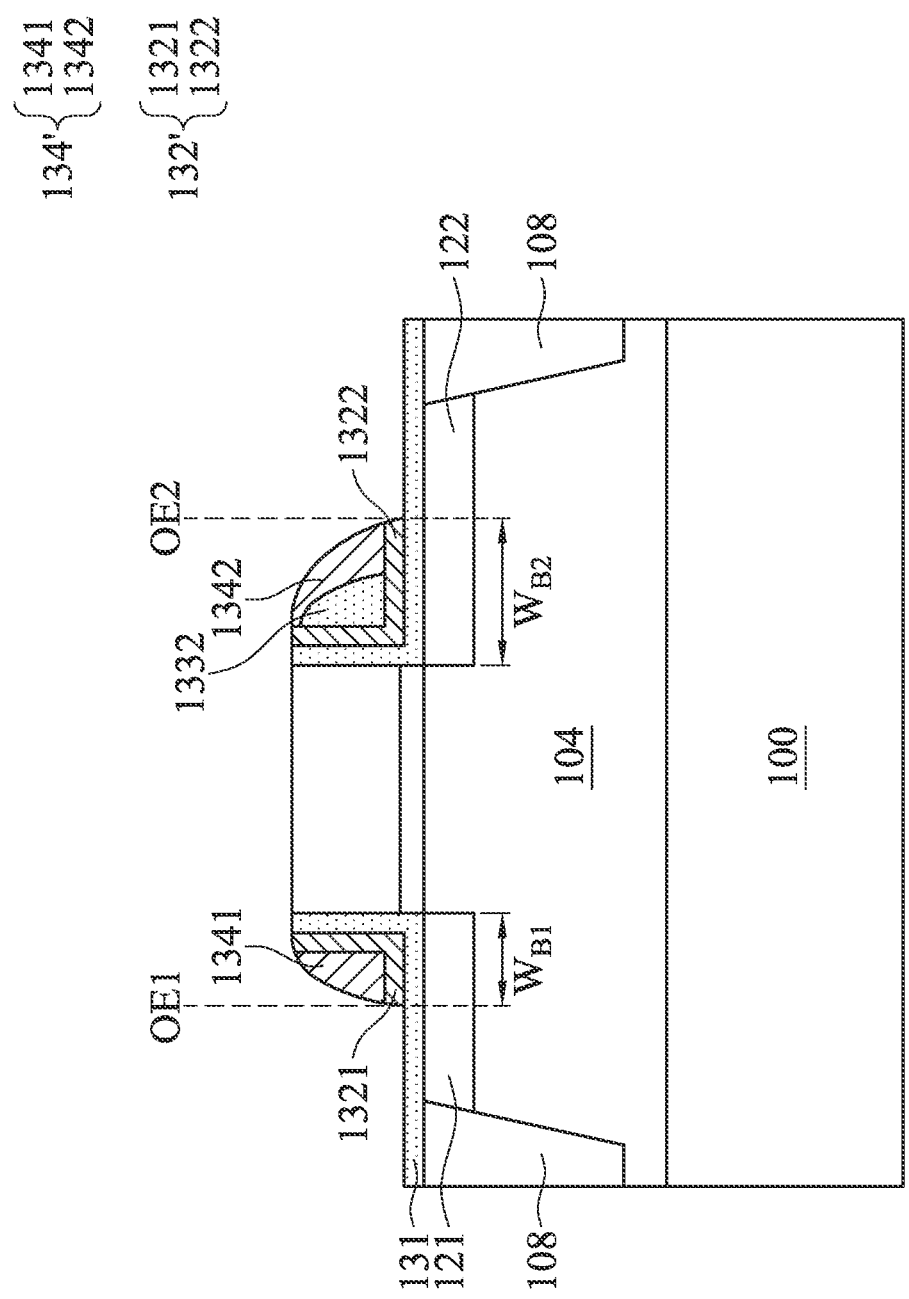

Referring to FIG. 1G, in some embodiments, a patterning step is performed on the spacer material layers that include a blanket deposition of the fourth spacer material layer 134 and the second spacer material layer 132 to form asymmetrical portions on opposite sidewalls of the gate structure 110. In this example, the patterned fourth spacer material layer 134' includes the patterned fourth spacer portions 1341 and 1342 respectively over the first sidewall 110S1 and the second sidewall 110S2 of the gate structure 110. The patterned second spacer material layer 132' includes the patterned second spacer portions 1321 and 1322 respectively adjacent to the first sidewall 110S1 and the second sidewall 110S2 of the gate structure 110. After the patterning step, as shown in FIG. 1G, the remaining initial spacer portion 1332 is disposed between the patterned fourth spacer portion 1342 and the patterned second spacer portion 1322.

In some embodiments, the fourth spacer material layer 134 and the second spacer material layer 132 are patterned by a dry etching process. In some embodiments, the fourth spacer material layer 134 and the second spacer material layer 132 are patterned by an anisotropic dry etching process. Also, the fourth spacer material layer 134 and the second spacer material layer 132 can be patterned to form those asymmetrical portions without providing any mask above the fourth spacer material layer 134 and the second spacer material layer 132. In addition, in this exemplified embodiment, an anisotropic etch to the fourth spacer material layer 134 and the second spacer material layer 132 (e.g. the silicon nitride layers) provides high selectivity to the remaining initial spacer portion 1332 (e.g. the silicon oxide portion), and the remaining initial spacer portion 1332 is substantially not etched during this anisotropic etch step.

Figure 1H:
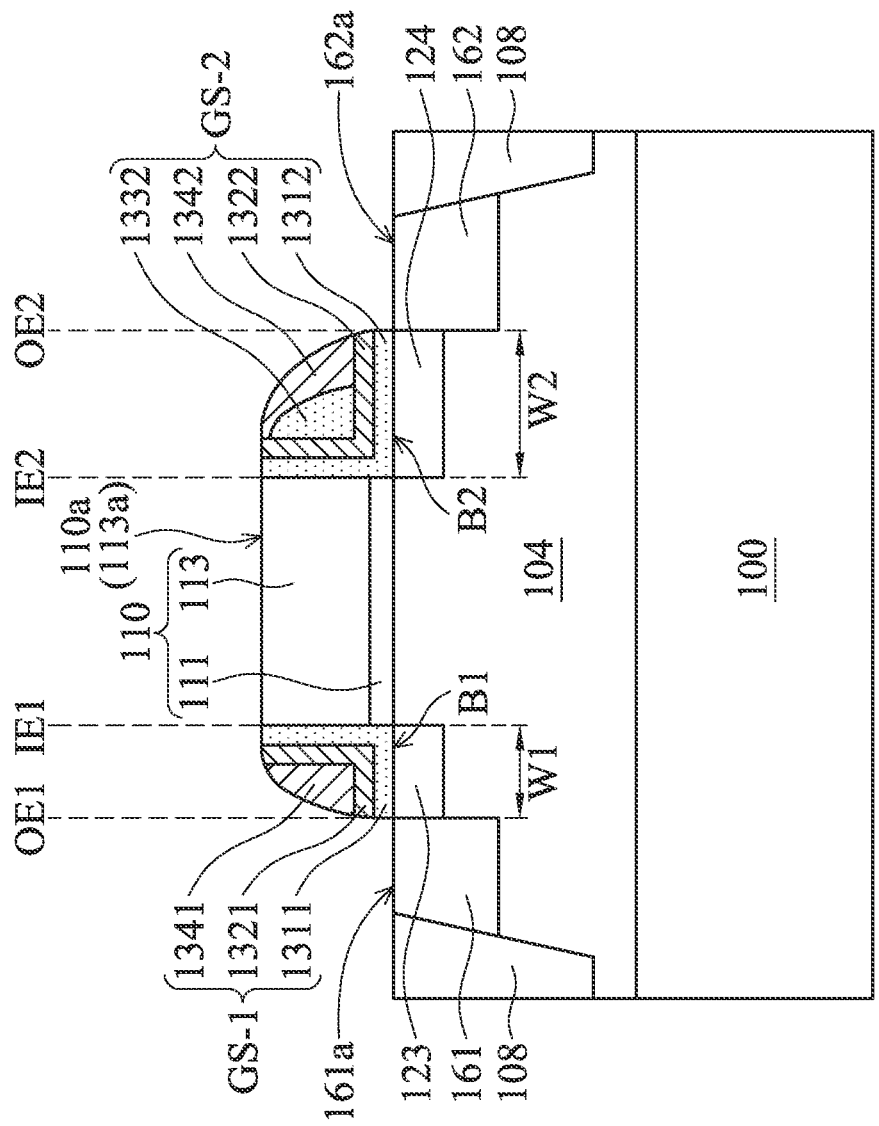

Next, referring to FIG. 1H, in some embodiments, the exposed portions of the first spacer material layer 131 on the upper surface 100a of the semiconductor substrate 100, that is not covered by the patterned fourth spacer material layer 134' and the patterned second spacer material layer 132', are removed. A patterned first spacer material layer 131' is thus formed in such a manner that it is aligned with the outer edges of the patterned second spacer material layer 132' and the patterned fourth spacer material layer 134'. In this example, the patterned first spacer material layer 131' includes the patterned first spacer portions 1311 and 1312 respectively adjacent to the first sidewall 110S1 and the second sidewall 110S2 of the gate structure 110.

In some embodiments, the exposed portions of the first spacer material layer 131 that is not covered by the patterned fourth spacer material layer 134' and the patterned second spacer material layer 132' are removed by a wet etching process. In one example, a wet cleaning step is performed on the structure as shown in FIG. 1G to remove the exposed portions of the first spacer material layer 131 and undesirable native oxides that are spontaneously formed on the surfaces of the material layers.

In some embodiments, as shown in FIG. 1H, after the exposed portions of the first spacer material layer 131 are removed to form the patterned first spacer material layer 131', a gate spacer structure GS including two asymmetrical portions on opposite sidewalls of the gate structure 110 is formed. The gate spacer structure GS includes the first spacer portion GS-1 on the first sidewall 110S1 of the gate structure 110 and the second spacer portion GS-2 on the second sidewall 110S2 of the gate structure 110. In this exemplified embodiments, the patterned first spacer portions 1311, the patterned second spacer portion 1321 and the patterned fourth spacer portion 1341 on the first sidewall 110S1 of the gate structure 110 collectively form the first spacer portion GS-1 of the gate spacer structure GS. In some embodiments, the patterned first spacer portions 1312, the patterned second spacer portion 1322, the remaining initial spacer portion 1332 and the patterned fourth spacer portion 1342 on the second sidewall 110S2 of the gate structure 110 collectively form the second spacer portion GS-2 of the gate spacer structure GS.

In addition, referring to FIG. 1H, heavily doped regions 160 such as a source region 161 and a drain region 162 are formed in the semiconductor substrate 100. The source region 161 and the drain region 162 are near the first sidewall 110S1 and the second sidewall 110S2 of the gate structure 110, respectively. According to the embodiments, the source region 161 and the drain region 162 are formed by using the gate structure 110 and the asymmetrical portions (i.e. the first spacer portion GS-1 and the second spacer portion GS-2) of the gate spacer structure GS as an implant mask. Therefore, no extra mask is required during the formation of the source region 161 and the drain region 162, in accordance with some embodiments of the present disclosure.

Also, the inner edges of the source region 161 and the drain region 162 can be self-aligned with the outer edges of the first spacer portion GS-1 and the second spacer portion GS-2 of the gate spacer structure GS, in accordance with some embodiments of the present disclosure. As shown in FIG. 1H, the inner edge of the source region 161 is aligned with an outer edge OE1 of the first spacer portion GS-1, and the inner edge of the drain region 162 is aligned with an outer edge OE2 of the second spacer portion GS-2. In other words, no spacer material covers the top surface 161a of the source region 161 and the top surface 162a of the drain region 162, in accordance with some embodiments of the present disclosure. Therefore, according to some embodiments, the entire top surface 161a of the source region 161 and the entire top surface 162a of the drain region 162 provide large areas for forming silicide regions (not shown) on the source region 161 and the drain region 162 in the subsequent process.

In addition, FIG. 1G and FIG. 1H depict the bottom widths and lateral extending lengths of the asymmetrical portions of the gate spacer structure GS. Referring to FIG. 1G and FIG. 1H, in some embodiments, the first spacer portion GS-1 of the gate spacer structure GS has a bottom width $W_{B1}$ (e.g. defined in the first direction D1, such as X-direction in FIG. 1G) between an outer edge OE1 of the first spacer portion GS-1 and the gate structure 110. The second spacer portion GS-2 of the gate spacer structure GS has a bottom width $W_{B2}$ (e.g. defined in the first direction D1, such as X-direction in FIG. 1G) between an outer edge OE2 of the second spacer portion GS-2 and the gate structure 110. The bottom width $W_{B2}$ is greater than the bottom width $W_{B1}$ ($W_{B2}>W_{B1}$), as shown in FIG. 1G.

In some embodiments, the bottom width $W_{B1}$ of the first spacer portion GS-1 can be defined as a lateral distance W1 (FIG. 1H) between the source region 161 and the gate structure 110. That is, the bottom width $W_{B1}$ (FIG. 1G) of the first spacer portion GS-1 is equal to the lateral distance W1 between the source region 161 and the gate structure 110. In some embodiments, the lateral distance W1 can be referred to as the first width W1 of the bottom surface of the first spacer portion GS-1. Similarly, the bottom width $W_{B2}$ of the second spacer portion GS-2 can be defined as a lateral distance W2 between the drain region 162 and the gate structure 110. That is, the bottom width $W_{B2}$ of the second spacer portion GS-2 is equal to the lateral distance W2 between the drain region 162 and the gate structure 110. In some embodiments, the lateral distance W2 can be referred to as the second width W2 of the bottom surface of the second spacer portion GS-2.

According to some embodiments, the bottom width $W_{B2}$ (e.g. in the first direction D1) of the second spacer portion GS-2 is greater than the bottom width $W_{B1}$ (e.g. in the first direction D1) of the first spacer portion GS-1, as shown in FIG. 1G. In other words, in some embodiments, the lateral distance W2 (e.g. the second width W2) between the drain region 162 and the gate structure 110 is greater than the lateral distance W1 (e.g. the first width W1; W2>W1) between the source region 161 and the gate structure 110, as shown in FIG. 1H.

In some embodiments, the first spacer portion GS-1 overlying the first sidewall 110S1 of the gate structure 110 has a first bottom surface B1, and the second spacer portion GS-2 overlying the second sidewall 110S2 of the gate structure 110 has a second bottom surface B2. The second bottom surface B2 is greater than the first bottom surface B1. In addition, the bottom width $W_{B1}$ may be the critical dimension (i.e. the largest width in the first direction D1) of the first bottom surface B1 of the first spacer portion GS-1, and the bottom width $W_{B2}$ may be the critical dimension (i.e. the largest width in the first direction D1) of the second bottom surface B2 of the second spacer portion GS-2. Therefore, the bottom width $W_{B2}$ of the second spacer portion GS-2 is greater than the bottom width $W_{B1}$ of the first spacer portion GS-1. According to the embodiments, the remaining initial spacer portion 1332 of the second spacer portion GS-2 is formed to increase the bottom width $W_{B2}$ of the second spacer portion GS-2, thereby extending the lateral length W2 between the drain region 162 and the gate structure 110. That is, the bottom width $W_{B2}$ of the second spacer portion GS-2 can be controlled by adjusting the bottom width of the remaining initial spacer portion 1332. In addition, if the remaining initial spacer portion 1332 with a greater bottom width is required, the thicker third spacer material layer 133 is deposited in FIG. 1B. According to the embodiments, the greater bottom width $W_{B2}$ of the second spacer portion GS-2 (or the lateral length W2 between the drain region 162 and the gate structure 110) does increase the breakdown voltage and enlarge the zone of the safe operating area (SOA) of the semiconductor device, thereby improving the electrical performance of the semiconductor device.

In addition, in some embodiments, after the source region 161 and the drain region 162 are formed, the first lightly doped region 123 is positioned between the source region 161 and the gate structure 110, and the second lightly doped region 124 is positioned between the drain region 162 and the gate structure 110. Also, the first spacer portion GS-1 of the gate spacer structure GS is formed over the first lightly doped region 123, and the second spacer portion GS-2 of the gate spacer structure GS is formed over the second lightly doped region 124. Specifically, as shown in FIG. 1H, the first lightly doped region 123 is beneath the first spacer portion GS-1 and adjacent to the first sidewall 110S1 of the gate structure 110, and the second lightly doped region 124 is beneath the second spacer portion GS-2 and adjacent to the second sidewall 110S2 (which is opposite the first sidewall 110S1) of the gate structure 110.

In addition, as shown in FIG. 1H, after the source region 161 and the drain region 162 are formed, the first lightly doped region 123 and the second lightly doped region 124 have different widths that extend along the upper surface 100a of the semiconductor substrate 100, in accordance with some embodiments of the present disclosure. In this exemplified embodiment, the width (in the first direction D1) of the second lightly doped region 124 between the gate structure 110 and the drain region 162 is greater than the width (in the first direction D1) of the first lightly doped region 123 between the gate structure 110 and the source region 161. As shown in FIG. 1H, the width of the second lightly doped region 124 between the gate structure 110 and the source region 161 can be referred to as the first width W1 of the first bottom surface B1 of the first spacer portion GS-1. Similarly, the width of the second lightly doped region 124 between the gate structure 110 and the drain region 162 can be referred to as the second width W2 of the second bottom surface B2 of the second spacer portion GS-2.

In addition, in some embodiments, the inner edge of the first lightly doped regions 123 and the inner edge of the second lightly doped region 124 in the semiconductor substrate 100 are aligned respectively with the inner edge IE1 of the first spacer portion GS-1 and the inner edge IE2 of the second spacer portion GS-2, as shown in FIG. 1F. Also, because the source region 161 and the drain region 162 are formed by using the gate structure 110 and the gate spacer structure GS as an implant mask, the outer edges of the first lightly doped region 123 and the second lightly doped region 124 that contact the source region 161 and the drain region 162 are aligned respectively with the outer edges of the two asymmetrical portions of the gate spacer structure GS after the source region 161 and the drain region 162 are formed. For example, the outer edge of the first lightly doped region 123 is aligned with the outer edge OE1 of the first spacer portion GS-1, and the outer edge of the second lightly doped region 124 is aligned with the outer edge OE2 of the second spacer portion GS-2.

Figure 1I:
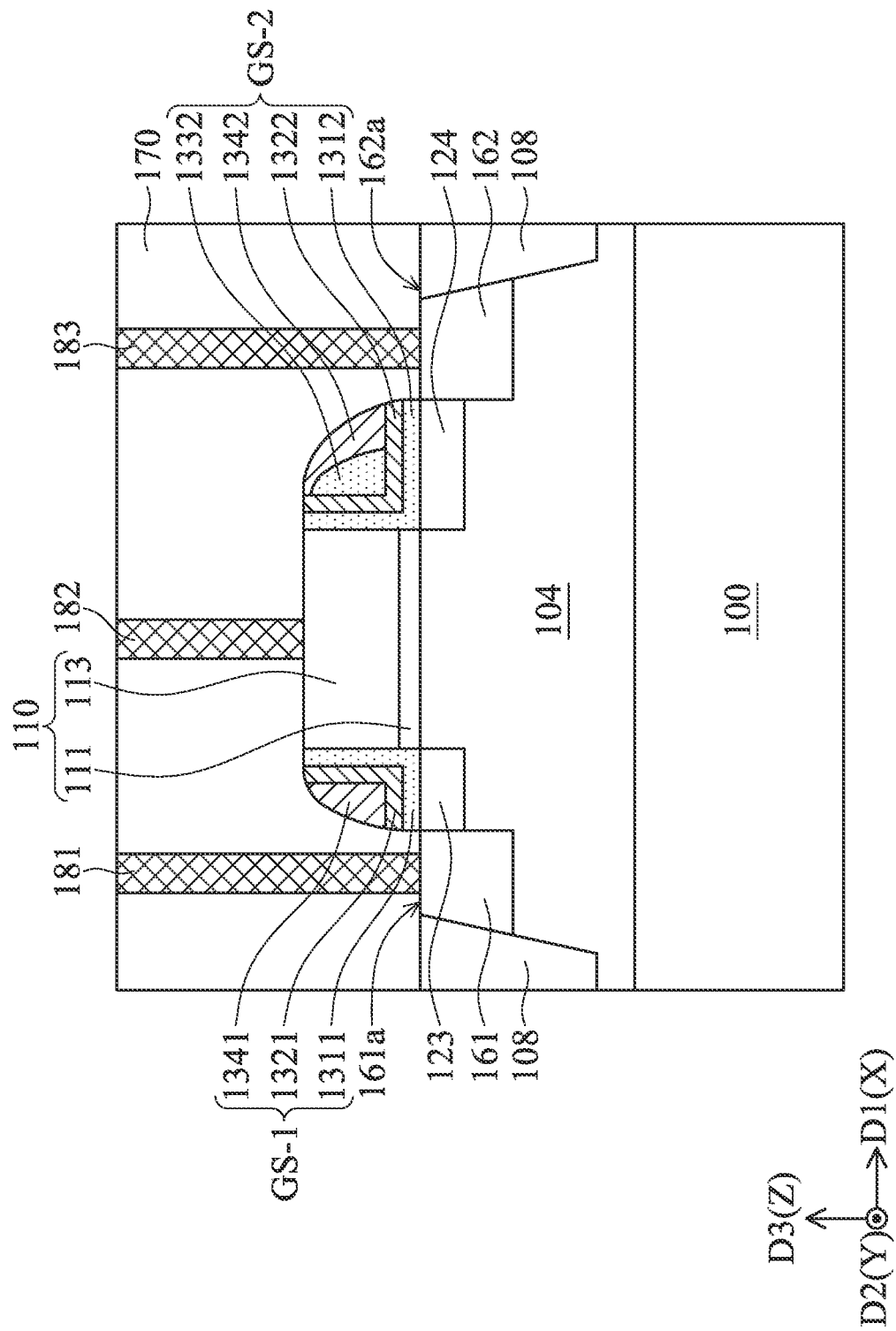

Referring to FIG. 1I, in some embodiments, an inter-layer dielectric (ILD) layer 170 is formed over the semiconductor substrate 100. Then, the contact plugs are formed by filling contact openings (not shown) in the inter-layer dielectric layer 170 with conductive materials. As shown in FIG. 1I, the contact plugs 181, 182 and 183 contact the source region 161, the gate structure 110 and the drain region 162, respectively.

In some embodiments, before the inter-layer dielectric layer 170 is deposited, silicide regions (not shown) can be further formed on the source region 161, the gate structure 110 and the drain region 162 to reduce gate (e.g. polysilicon gate) contact resistance and source/drain contact resistance. In some embodiments, the silicide regions can be formed by blanket depositing a metal layer (not shown) on the previously formed structure shown in FIG. 1H, and an annealing process is performed. When annealed, the metal layer reacts with the underlying silicon and silicide regions are formed on the source region 161, the gate structure 110 and the drain region 162. The un-reacted metal layer is then removed after the annealing process.

In addition, in some embodiments, after the silicide regions are formed, a contact etch stop layer (not shown) is further formed by a blanket deposition to cover the entire structure in FIG. 1H. The contact etch stop layer can act as an etch stop layer during the formation of contact openings, thereby protecting underlying regions from being over etched. Also, the contact etch stop layer provides a stress, preferably a tensile stress for an NMOS transistor, to the semiconductor device and enhances carrier mobility. Next, the inter-layer dielectric layer 170 is deposited on the contact etch stop layer. Then, the contact openings are made through the inter-layer dielectric layer 170 and those contact openings are filled with a conductive material layer. A planarization process, such as chemical mechanical planarization, another suitable planarization method or a combination thereof, is then performed to planarize the conductive material layer and the inter-layer dielectric material, thereby forming the contact plugs 181, 182 and 183 and the inter-layer dielectric layer 170 with planarized top surfaces, as shown in FIG. 1I. In some embodiments, the contact plugs 181, 182 and 183 contact the silicide regions (not shown) on the source region 161, the gate structure 110 and the drain region 162, respectively.

According to some embodiments, a semiconductor device includes a gate spacer structure GS having the first spacer portion GS-1 and the second spacer portion GS-2 with different bottom widths respectively overlying opposite sidewalls (e.g. the first sidewall 110S1 and the second sidewall 110S2) of the gate structure 110. In some embodiments, the inner edges of the source region 161 and the drain region 162 are aligned respectively with outer edges (e.g. OE1 and OE2) of the asymmetrical first spacer portion GS-1 and the second spacer portion GS-2 of the gate spacer structure GS. Also, the bottom width $W_{B2}$ (e.g. identical to the lateral distance/second width W2) of the second spacer portion GS-2 between the drain region 162 and the gate structure 110 is greater than bottom width $W_{B1}$ (e.g. identical to the lateral distance/first width W1) of the first spacer portion GS-1 between the source region 161 and the gate structure 110. According to some embodiments, the extended distance (i.e. W2>W1) between the drain region 162 and the gate structure 110 does increase the breakdown voltage and enlarge the zone of the safe operating area (SOA) of the semiconductor device. Also, the extended distance between the drain region 162 and the gate structure 110 of the semiconductor device reduces the undesirable parasite capacitance between the gate structure 110 and a drain contact plug 183 that is connected to the drain region 162. Accordingly, more current is allowed to flow from the source to the drain terminal of the semiconductor device of some embodiments of the present disclosure, and the semiconductor device can be operated at a higher switching speed. Thus, the electrical performance of the semiconductor device in accordance with some embodiments of the present disclosure can be greatly improved.

In addition, the configurations of the gate spacer structure GS in the aforementioned embodiments, such as the shapes and arrangements of the spacer material layers in the first spacer portion GS-1 and the second spacer portion GS-2 in FIG. 1G, FIG. 1H and FIG. 1I, are merely provided for illustration of some applicable types. It should be noted that the present disclosure is not limited to the structural configurations of the gate spacer structure GS in the embodiments described previously. According to the present disclosure, the first spacer portion GS-1 and the second spacer portion GS-2 of the gate spacer structure GS may have varied shapes and arrangements of the spacer material layers to achieve the spacer portion (i.e. GS-2) near the drain region 162 having the greater bottom width than the spacer portion (i.e. GS-1) near the source region 161.

Figure 2:
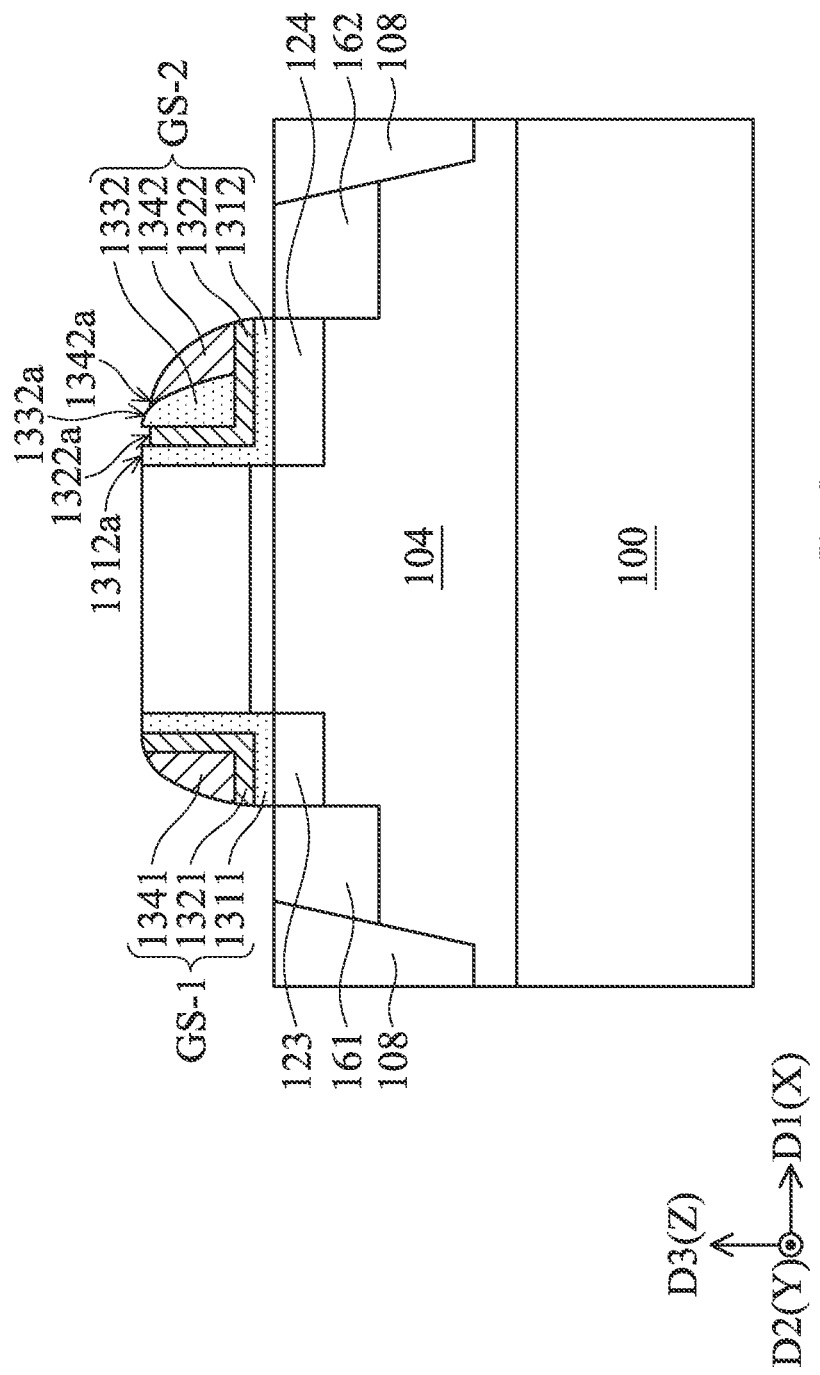
FIG. 2 is a cross-sectional view of an intermediate stage of a semiconductor device, in accordance with some embodiments of the present disclosure.

FIG. 2 is a cross-sectional view of an intermediate stage of a semiconductor device, in accordance with some embodiments of the present disclosure. The intermediate structure in FIG. 2 is identical to the intermediate structure in FIG. 1H except for the configuration of the gate spacer structure GS.

Features of the structures in FIG. 2 and FIG. 1H that are the same or similar are numbered in a similar way for the sake of simplicity and clarity. The configurations of those features in FIG. 2 and FIG. 1H that are the same or similar have been described in the embodiments described previously, and the details are not repeated herein. Also, the method for forming the structure in FIG. 2 that has a well region 104 and the isolation structure 108 in the semiconductor substrate 100, the gate structure 110, the gate spacer structure GS having two asymmetrical portions (e.g. the first spacer portion GS-1 and the second spacer portion GS-2) on opposite sidewalls of the gate structure 110, the first lightly doped region 123, the second lightly doped region 124, the source region 161 and the drain region 162 are similar to those contents in the previously described embodiment. For the purpose of brevity, the materials of the same or similar components/layers and processes of forming those components/layers are not repeated herein.

Figure 3:
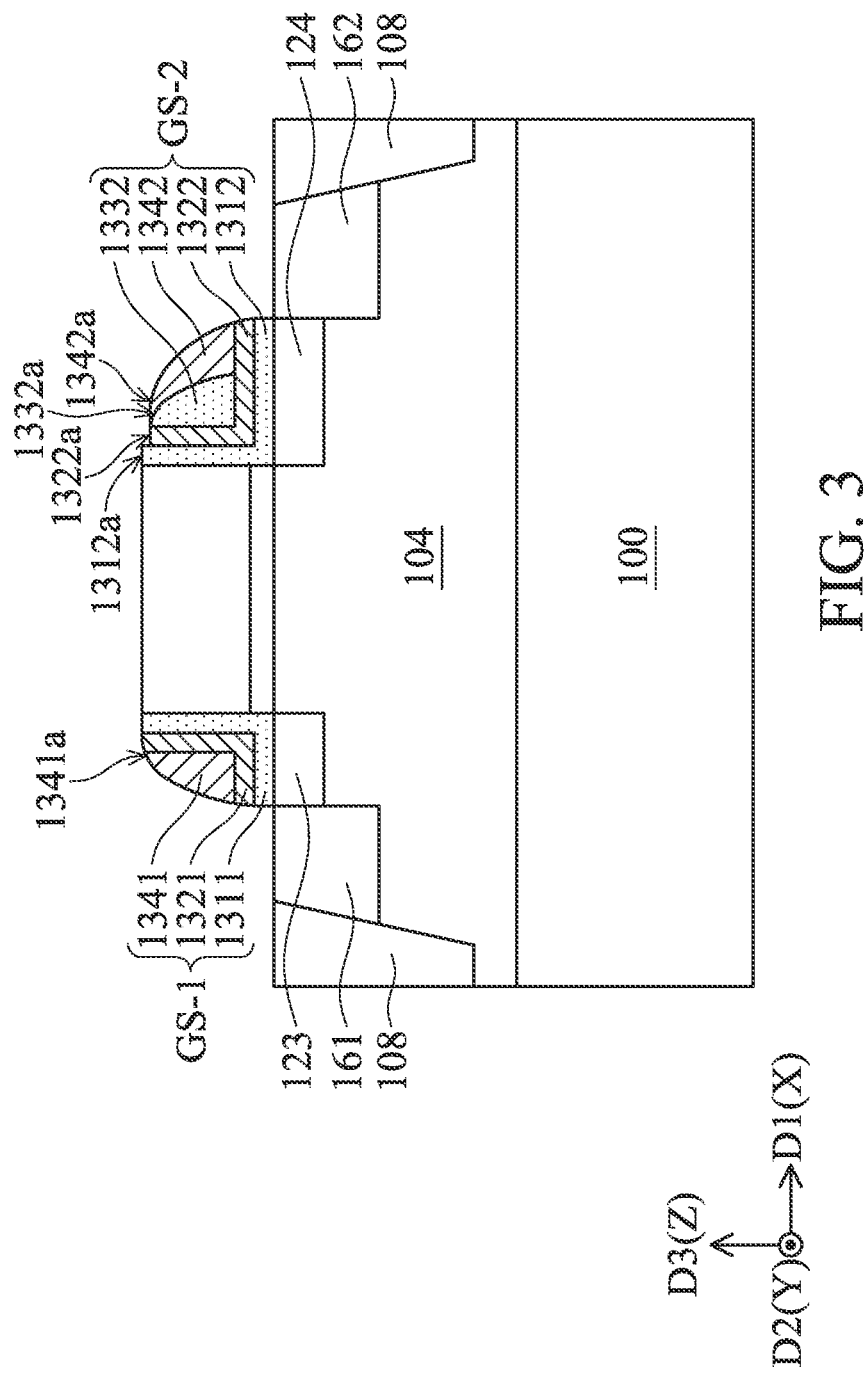
FIG. 3 is a cross-sectional view of an intermediate stage of a semiconductor device, in accordance with some embodiments of the present disclosure.

According to the intermediate structures in FIG. 1G, FIG. 1H and FIG. 1I as described above, the remaining initial spacer portion 1332 that is formed for increasing the bottom width $W_{B2}$ of the second spacer portion GS-2 is completely encapsulated by the patterned fourth spacer portion 1342 and the patterned second spacer portion 1322. However, the present disclosure is not limited to the structural configurations of the second spacer portion GS-2 in the embodiments described previously. Referring to FIG. 3, in some embodiments, the remaining initial spacer portion 1332 can be positioned between the fourth spacer material layer 134 and the second spacer material layer 132, but not completely encapsulated by the fourth spacer material layer 134 and the second spacer material layer 132.

Referring to the intermediate stages of FIG. 1F and FIG. 1G for forming a semiconductor device, the fourth spacer material layer 134 and the second spacer material layer 132 may include silicon nitride, and the remaining initial spacer portion 1332 may include silicon oxide. When an anisotropic etch is performed to pattern the fourth spacer material layer 134 and the second spacer material layer 132 (e.g. as shown in FIG. 1G), the anisotropic etch to the fourth spacer material layer 134 and the second spacer material layer 132 provides high selectivity to the remaining initial spacer portion 1332, and the remaining initial spacer portion 1332 is substantially not etched during this patterning step. Accordingly, after the anisotropic etch step is performed to form the gate spacer structure GS, the remaining initial spacer portion 1332 may be slightly protruded between the patterned second spacer portion 1322 and the patterned fourth spacer portion 1342 of the second spacer portion GS-2.

In this example, as shown in FIG. 2, the top surface 1332a of the remaining initial spacer portion 1332 is exposed through the patterned second spacer portion 1322 and the patterned fourth spacer portion 1342. In some embodiments, the top surface 1332a of the remaining initial spacer portion 1332 is higher than the top surface 1322a of the patterned second spacer portion 1322 and the uppermost surface 1342a of the patterned fourth spacer portion 1342. In addition, the top surface 1322a of the patterned second spacer portion 1322 and the uppermost surface 1342a of the patterned fourth spacer portion 1342 may be lower than the top surface 1322a of the patterned first spacer portion 1312, wherein the patterned first spacer portion 1312 covers the second sidewall 110S2 of the gate structure 110.

Regardless of whether the patterned second spacer portion 1322 is encapsulated by the patterned fourth spacer portion 1342 and the patterned second spacer portion 1322 (as shown in FIG. 1G) or exposed through the patterned fourth spacer portion 1342 and the patterned second spacer portion 1322 (as shown in FIG. 2), the bottom width $W_{B2}$ of the second spacer portion GS-2 can be extended to increase the distance between the drain region 162 and the gate structure 110 due to the formation of the remaining initial spacer portion 1332. Therefore, the undesirable parasite capacitance between the gate structure 110 and a drain contact plug 183 that is connected to the drain region 162 can be reduced. Also, the breakdown voltage and the zone of the safe operating area (SOA) of the semiconductor device can be significantly increased.

FIG. 3 is a cross-sectional view of an intermediate stage of a semiconductor device, in accordance with some embodiments of the present disclosure. The intermediate structure in FIG. 3 is identical to the intermediate structure in FIG. 1H except for the configuration of the gate spacer structure GS.

Features of the structures in FIG. 3 and FIG. 1H that are the same or similar are numbered in a similar way for the sake of simplicity and clarity. The configurations of those features in FIG. 3 and FIG. 1H that are the same or similar have been described in the previous embodiments, and the details are not repeated herein. Also, the method for forming the structure in FIG. 3 that has a well region 104 and the isolation structure 108 in the semiconductor substrate 100, the gate structure 110, the gate spacer structure GS having two asymmetrical portions (e.g. the first spacer portion GS-1 and the second spacer portion GS-2) on opposite sidewalls of the gate structure 110, the first lightly doped region 123, the second lightly doped region 124, the source region 161 and the drain region 162 are similar to those contents in the previously described embodiment. For the purpose of brevity, the materials of the same or similar components, layers and processes for forming those components and layers are not repeated herein.

Referring to the intermediate stages of FIG. 1F and FIG. 1G for forming a semiconductor device, the fourth spacer material layer 134 and the second spacer material layer 132 may include silicon nitride, and the remaining initial spacer portion 1332 may include silicon oxide.

Referring to the intermediate stages of FIG. 1E, FIG. 1F and FIG. 1G for forming a semiconductor device, the remaining initial spacer portion 1332 may have effect on the deposition of the fourth spacer material layer 134, so that a less amount of the material of the fourth spacer material layer 134 deposits on the remaining initial spacer portion 1332. Referring to FIG. 3, when an anisotropic etch is performed to pattern the fourth spacer material layer 134 and the second spacer material layer 132 (e.g. as shown in FIG. 1G), the patterned fourth spacer portion 1341 of the first spacer portion GS-1 may be higher than the patterned fourth spacer portion 1342 of the second spacer portion GS-2. Specifically, the uppermost surface 1342a of the patterned fourth spacer portion 1342 is lower than the uppermost surface 1341a of the patterned fourth spacer portion 1341. The top surface 1322a of the patterned second spacer portion 1322 and the uppermost surface 1342a of the patterned fourth spacer portion 1342 may be substantially aligned with the top surface 1332a of the remaining initial spacer portion 1332. In addition, the top surface 1322a of the patterned second spacer portion 1322 and the uppermost surface 1342a of the patterned fourth spacer portion 1342 may be lower than the top surface 1322a of the patterned first spacer portion 1312, wherein the patterned first spacer portion 1312 covers the second sidewall 110S2 of the gate structure 110.

Regardless of whether the patterned fourth spacer portion 1342 is coplanar with the patterned fourth spacer portion 1341 (as shown in FIG. 1G) or lower than the patterned fourth spacer portion 1341 (as shown in FIG. 3), the bottom width $W_{B2}$ of the second spacer portion GS-2 can be extended to increase the distance between the drain region 162 and the gate structure 110 due to the formation of the remaining initial spacer portion 1332. Therefore, the undesirable parasite capacitance between the gate structure 110 and a drain contact plug 183 that is connected to the drain region 162 can be reduced. Also, the breakdown voltage and the zone of the safe operating area (SOA) of the semiconductor device can be significantly increased.

According to some embodiments described above, the semiconductor devices and methods of forming the same achieve several advantages. In some embodiments, the gate spacer structure GS includes the first spacer portion GS-1 and the second spacer portion GS-2 respectively overlying opposite sidewalls (e.g. the first sidewall 110S1 and the second sidewall 110S2) of the gate structure 110 in a semiconductor device. The first spacer portion GS-1 and the second spacer portion GS-2 are adjacent to the source region 161 and the drain region 162, respectively. The bottom width $W_{B2}$ of the second spacer portion GS-2 is greater than the bottom width $W_{B1}$ of the first spacer portion GS-1. According to the embodiments, the greater bottom width $W_{B2}$ of the second spacer portion GS-2 extends the lateral distance between the gate structure 110 and the drain region 162, so that the breakdown voltage and the zone of the safe operating area (SOA) of the semiconductor device can be increased. Also, the extended distance between the drain region 162 and the gate structure 110 of the semiconductor device reduces the undesirable parasite capacitance between the gate structure 110 and a drain contact plug 183 that is connected to the drain region 162. Accordingly, more current is allowed to flow from the source to the drain terminal of the semiconductor device of some embodiments of the present disclosure, and the semiconductor device can be operated at a higher switching speed. In addition, the method of forming the semiconductor device, in accordance with some embodiments, is simple and compatible with the current processes. The structural configurations of the features in the semiconductor device formed by the method in accordance with some embodiments also bring some advantages. For example, the source region 161 and the drain region 162 formed in the semiconductor substrate are self-aligned with outer edges (e.g. OE1 and OE2) of the asymmetrical portions of the gate spacer structure GS, thereby providing large contact areas for the contact plugs disposed on the source region 161 and the drain region 162 in the subsequent process. According to the aforementioned descriptions, the electrical performance of the semiconductor device, in accordance with some embodiments of the present disclosure, can be significantly improved.

It should be noted that the details of the structures and fabrications of the embodiments are provided for exemplification, and the described details of the embodiments are not intended to limit the present disclosure. It should be noted that not all embodiments of the invention are shown. Modifications and variations can be made without departing from the spirit of the disclosure to meet the requirements of the practical applications. Thus, there may be other embodiments of the present disclosure which are not specifically illustrated. Furthermore, the accompanying drawings are simplified for clear illustrations of the embodiment. Sizes and proportions in the drawings may not be directly proportional to actual products. Thus, the specification and the drawings are to be regard as an illustrative sense rather than a restrictive sense.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
a semiconductor substrate having a well region;
a gate structure formed over the well region of the semiconductor substrate,
a gate spacer structure comprising a first spacer portion and a second spacer portion on opposite sidewalls of the gate structure; and
a source region and a drain region formed in the semiconductor substrate and separated from the gate structure, wherein the source region is adjacent to the first spacer portion of the gate spacer structure, and the drain region is adjacent to the second spacer portion of the gate spacer structure,
wherein a bottom width of the second spacer portion is greater than a bottom width of the first spacer portion,
the second spacer portion includes a remaining initial spacer portion between a first patterned spacer portion and a second patterned spacer portion, the remaining initial spacer portion is made of a different material from the first patterned spacer portion and the second patterned spacer portion, the first patterned spacer portion includes a first part extending in a horizontal direction, the remaining initial spacer portion and the second patterned spacer portion are disposed on an upper surface of the first part of the first patterned spacer portion, and bottom surfaces of the remaining initial spacer portion and the second patterned spacer portion are aligned and in contact with upper surface of the first part of the first patterned spacer portion.

2. The semiconductor device as claimed in claim 1, wherein a bottom surface of the second spacer portion is greater than a bottom surface of the first spacer portion.

3. The semiconductor device as claimed in claim 1, wherein the bottom width of the first spacer portion is defined as a first lateral distance between the source region and the gate structure, and the bottom width of the second spacer portion is defined as a second lateral distance between the drain region and the gate structure, wherein the second lateral distance is greater than the first lateral distance.

4. The semiconductor device as claimed in claim 1, wherein the gate structure has a first sidewall and a second sidewall opposite the first sidewall, the first spacer portion and the second spacer portion are respectively formed on the first sidewall and the second sidewall of the gate structure.

5. The semiconductor device as claimed in claim 4, wherein the first spacer portion is disposed between the source region and the first sidewall of the gate structure, and the second spacer portion is disposed between the drain region and the second sidewall of the gate structure.

6. The semiconductor device as claimed in claim 1, wherein the gate spacer structure is made of multiple spacer material layers, and the first spacer portion and the second spacer portion of the gate spacer structure on the opposite sidewalls of the gate structure each has a different number of spacer material layers.

7. The semiconductor device as claimed in claim 1, wherein the number of spacer material layers forming the second spacer portion is greater than the number of spacer material layers forming the first spacer portion.

8. The semiconductor device as claimed in claim 1, wherein a top surface of the remaining initial spacer portion is exposed through top surfaces of the first and second patterned spacer portions.

9. The semiconductor device as claimed in claim 1, wherein a top surface of the remaining initial spacer portion is higher than top surfaces of the first and second patterned spacer portions.

10. The semiconductor device as claimed in claim 1, further comprising:
    lightly doped regions formed in the semiconductor substrate and beneath the first spacer portion and the second spacer portion of the gate spacer structure,
    wherein the lightly doped regions have different widths that extend along an upper surface of the semiconductor substrate.

11. The semiconductor device as claimed in claim 10, wherein outer edges of the lightly doped regions that contact the source region and the drain region are aligned respectively with outer edges of the first spacer portion and the second spacer portion of the gate spacer structure.

12. The semiconductor device as claimed in claim 1, wherein the remaining initial spacer portion is made of an oxide, the first patterned spacer portion and the second patterned spacer portion are made of nitride.

13. The semiconductor device as claimed in claim 1, wherein the first patterned spacer portion has an outer sidewall facing away from the gate structure, the second patterned spacer portion has an outer sidewall facing away from the gate structure, and the outer sidewall of the first patterned spacer portion is connected to the outer sidewall of the second patterned spacer portion to form a continuous surface.

* * * * *